(12) United States Patent
Yamaji et al.

(10) Patent No.: US 7,414,468 B2
(45) Date of Patent: Aug. 19, 2008

(54) AMPLIFIER, FILTER USING THE SAME, AND RADIO COMMUNICATION DEVICE

(75) Inventors: Takafumi Yamaji, Yokohama (JP); Rui Ito, Chigasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/928,766

(22) Filed: Oct. 30, 2007

(65) Prior Publication Data

US 2008/0064359 A1    Mar. 13, 2008

Related U.S. Application Data

(63) Continuation of application No. 11/387,317, filed on Mar. 23, 2006, now abandoned.

(30) Foreign Application Priority Data

Aug. 1, 2005    (JP) .............................. 2005-222769

(51) Int. Cl.
*H03F 3/45* (2006.01)
(52) U.S. Cl. ......................................... 330/69; 330/295
(58) Field of Classification Search .................. 330/69, 330/295, 124 R, 126, 147, 148
See application file for complete search history.

(56) References Cited

U.S. PATENT DOCUMENTS

| | | | |
|---|---|---|---|
| 3,325,653 A * | 6/1967 | Husher et al. ................ 326/127 |
| 5,041,795 A | 8/1991 | Bowers | |
| 6,563,380 B2 * | 5/2003 | Huijser ......................... 330/69 |
| 6,781,459 B1 * | 8/2004 | Brown .......................... 330/252 |
| 2007/0026835 A1 | 2/2007 | Yamaji et al. | |

FOREIGN PATENT DOCUMENTS

JP    2001-339989    12/2001

OTHER PUBLICATIONS

Koyama, et al., A 2.5-V Active Low-Pass Filter Using All-n-p-n Gilbert Cells with a 1-Vp-p Linear Input Range, IEEE Journal of Solid State Circuits, vol. 28, No. 12, pp. 1246-1253, Dec. 1993.
Itakura, et al., A 2.7-V, 200 kHz, 49-dBm, Stopband-IIP3, Low-Noise, Fully Balanced Gm-C Filter IC, IEEE Journal of Solid State Circuits, vol. 34, No. 8, pp. 1155-1159, Aug. 1999.

* cited by examiner

*Primary Examiner*—Henry K Choe
(74) *Attorney, Agent, or Firm*—Amin, Turocy & Calvin, LLP

(57) ABSTRACT

An amplifier includes an amplification unit which amplify a first difference between first and second input signals, a second difference between second and third input signals and a third difference between third and first input signals by a differential mode gain, and amplify an average of the first, second and third input signal by a common mode gain, for outputting a first output signal corresponding to a sum of the amplified first difference and the amplified average, a second output signal corresponding to a sum of the amplified second difference and the amplified average, and a third output signal corresponding to a sum of the amplified third difference and amplified average; first, second; and a reduction circuit which reduces the common mode gain less than the differential mode gain.

18 Claims, 10 Drawing Sheets

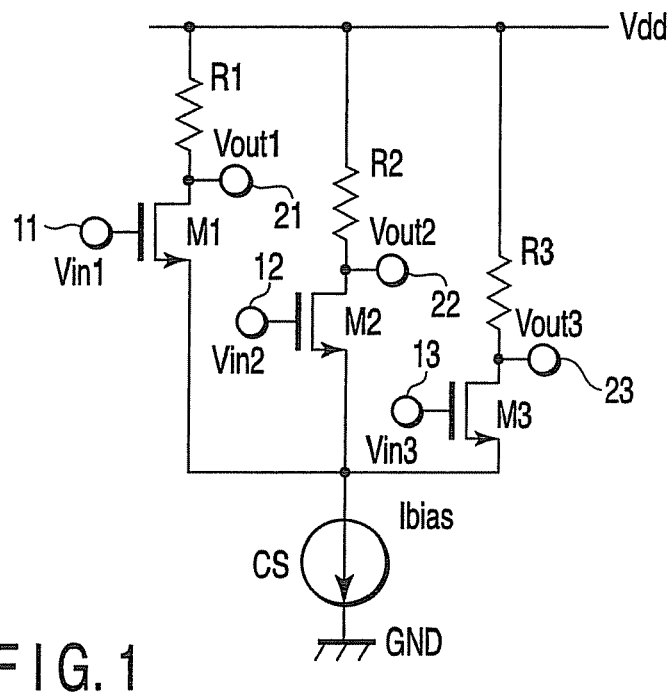
F I G. 1
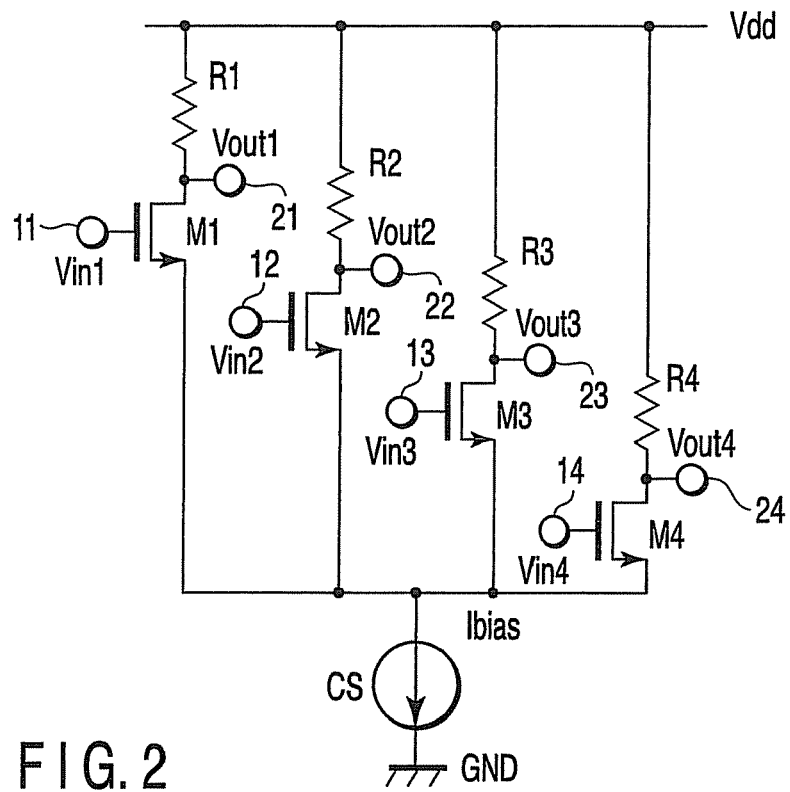
F I G. 2

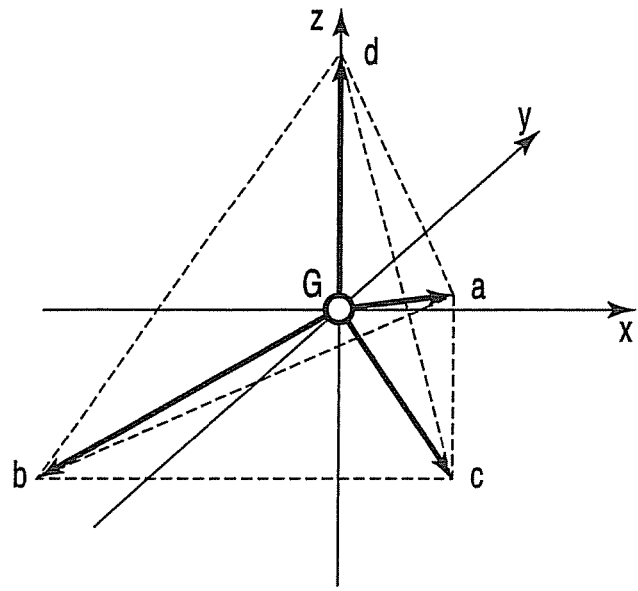
F I G. 3
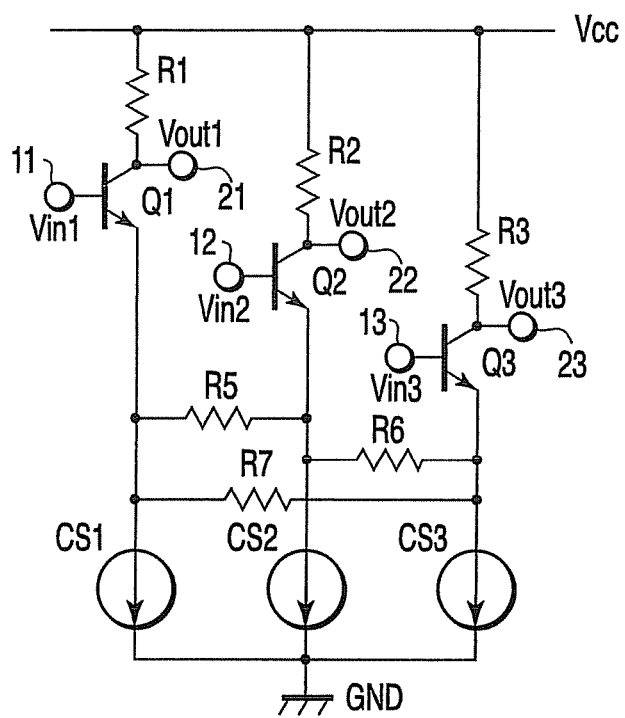
F I G. 4

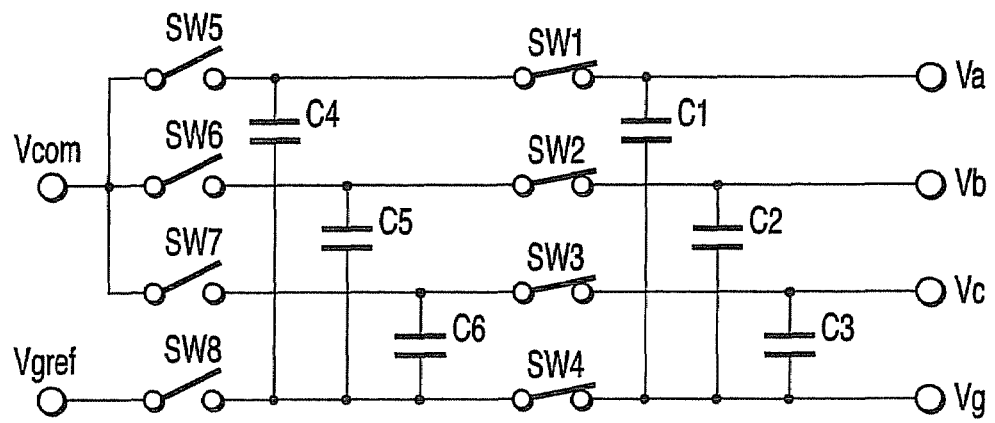
F I G. 9
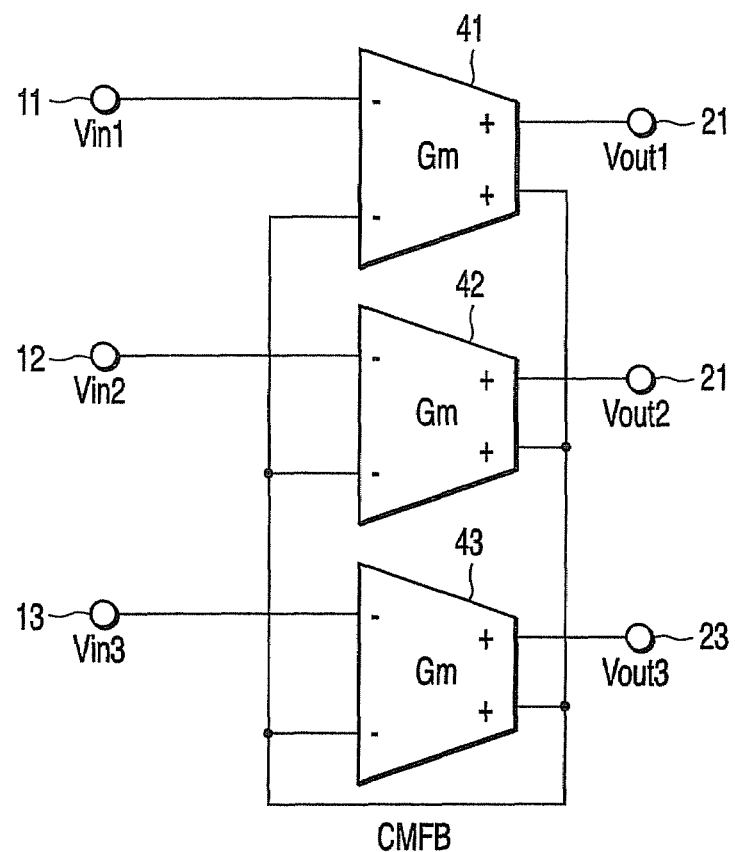
F I G. 10

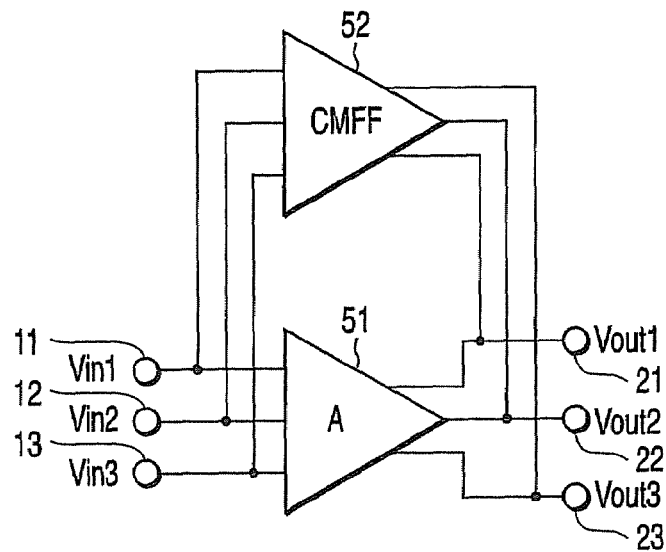
F I G. 11
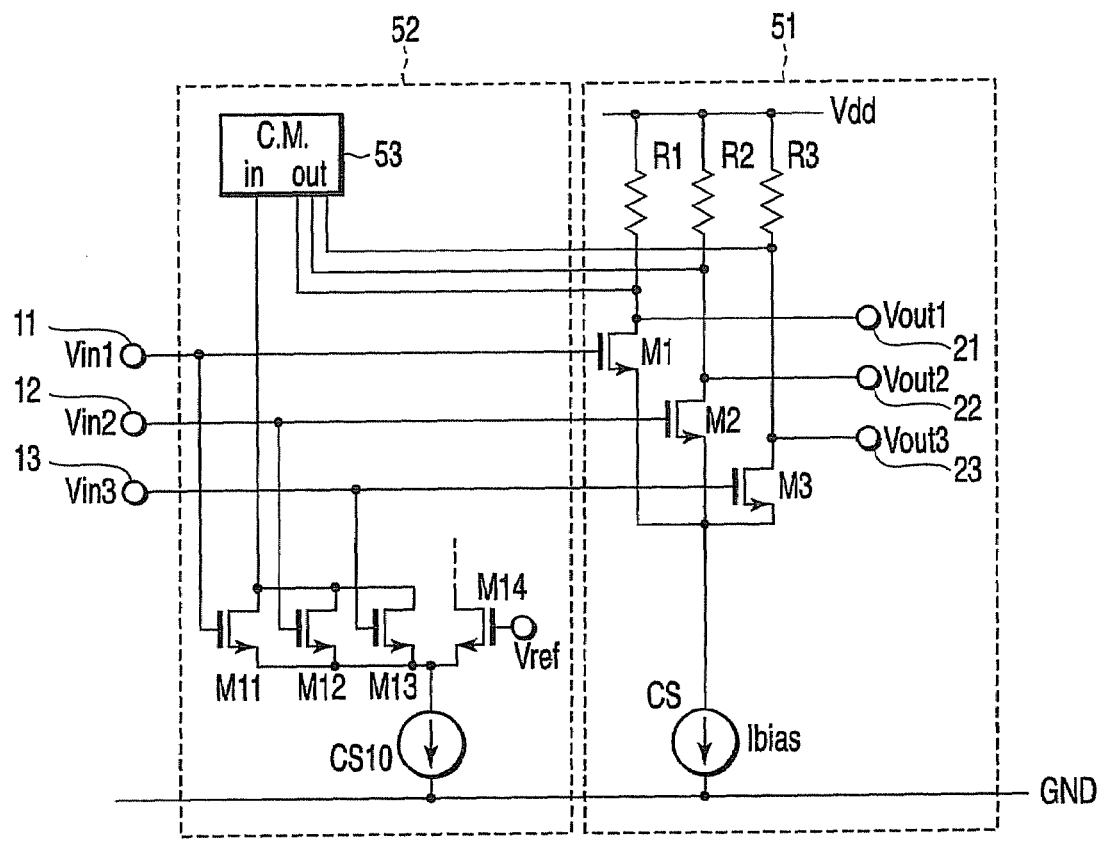
F I G. 12

AMPLIFIER, FILTER USING THE SAME, AND RADIO COMMUNICATION DEVICE

CROSS-REFERENCE TO RELATED APPLICATIONS

This application claims the benefit of priority from and is a continuation of co-pending application Ser. No. 11/387,317 filed on Mar. 23, 2006, the entire contents of which are incorporated herein by reference.

This application is based upon and claims the benefit of priority from the prior Japanese Patent Application No. 2005-222769, filed Aug. 1, 2005, the entire contents of which are incorporated herein by reference.

BACKGROUND OF THE INVENTION

1. Field of the Invention

The present invention relates to an amplifier, which especially handles an analog vector signal such as a complex number signal, and a filter and a radio communication device using the same.

2. Description of the Related Art

In a radio communication field as of 2005, there are adopted many systems for modulating both an amplitude and a phase of a signal. Therefore, in many cases, two orthogonal signals are used which are referred to as an in-phase signal (I-signal) and a quadrature-phase signal (Q-signal).

For example, in a case where a filter is formed, for example, on an integrated circuit as of around 1995, a single-ended system (circuit system in which a voltage between a signal line and the ground is handled as the signal) is adopted for both the I-signal and the Q-signal. An example of a filter of the single-ended system is described in "A 2.5-V active low-pass filter using all-n-p-n Gilbert cells with a 1-Vp-p range", authored by M. Koyama, T. Arai, H. Tanimoto, and Y. Yoshida, IEEE Journal of Solid-State Circuits, Vol. 28, No. 12, December 1993, pp. 1246 to 1253.

Since 2000, there has been increasingly adopted a differential system (circuit system in which a voltage between a positive signal line and a negative signal line is handled as the signal) for both the I-signal and the Q-signal. An example of a filter of the differential system is disclosed in "A 2.7-V, 200-kHz, 49-dBm, stopband-IIP3, low-noise, fully balanced gm-C filter IC", authored by T. Itakura, T. Ueno, H. Tanimoto, A. Yasuda, R. Fujimoto, T. Arai, and H. Kokatsu, IEEE Journal of Solid-State Circuits, Vol. 34, No. 8, August 1999, pp. 1155 to 1159.

An advantage of the single-ended system is that components are less than those of the differential system. Since a communication system in the 1990s has a low transmission rate, and requires a plurality of capacitors, several capacitors are mounted as external components of the integrated circuit on a circuit board. When the external components are as few as possible, costs are reduced. Therefore, the single-ended system is preferable.

However, in the single-ended system, separately from a power voltage and a ground potential, an analog ground potential needs to be supplied as an analog reference voltage to each amplifier in the integrated circuit. In this case, since a signal current flows into the analog ground potential, it is necessary to use an analog ground buffer amplifier having a high current driving capability (current supply capability and/or current absorbing capability). When an output impedance of the buffer amplifier is high, the analog ground potential varies with the signal current. This variation causes, for example, signal leakage from the I-signal into the Q-signal, or signal leakage from output into input. The latter signal leakage causes a problem of oscillation of the circuit.

Since 2000, in a radio communication system, a band has been broadened for high-speed data transmission. Therefore, a capacitor having a comparatively small capacity is being used. Most of components can be integrated on a chip, and accordingly the differential system has been increasingly adopted. In the differential system, a positive terminal and a negative terminal are loaded with voltages having an equal size and reverse polarities, respectively, to perform amplification or the like. An average value of the voltages of the positive and negative terminals virtually plays a role of the analog ground potential. Since the current output from the positive terminal flows into the negative terminal, no analog ground terminal has to be prepared. Since the differential system does not require the analog ground buffer amplifier required for the single-ended system, power consumption of the differential system becomes smaller than that of the single-ended system. Therefore, at present, the differential system is adopted in most cases.

As the cost per unit area of a semiconductor chip rises with development of a semiconductor fine processing technology, an analog circuit, especially, a passive element in the analog circuit occupies a large ratio of a chip area. Therefore, reduction of the area occupied by the passive element in the semiconductor chip is an important problem for cost reduction.

The single-ended system is advantageous for the reductions of the chip area and the cost in that there are fewer components. On the other hand, in the single-ended system, since the analog ground potential is supplied to each circuit block as described above, the analog ground buffer amplifier having a high current driving capability is required, and therefore, power consumption increases.

The differential system does not require the analog ground buffer amplifier required for the single-ended system, and the differential system has an advantage that the power consumption is reduced. On the other hand, the components of the differential system are more than those of the single-ended system, and the cost increases in the differential system.

BRIEF SUMMARY OF THE INVENTION

According to an aspect of the present invention, there is provided an amplifier comprising: a plurality of input terminals which receive a plurality of input signals, including a first input signal, a second input signal and a third input signal; an amplification unit configured to amplify a first difference between the first input signal and the second input signal, a second difference between the second input signal and the third input signal and a third difference between the third input signal and the first input signal by a differential mode gain, and amplify an input average of the plurality of input signals by a common mode gain, for outputting a first output signal corresponding to a sum of the amplified first difference and the amplified input average, a second output signal corresponding to a sum of the amplified second difference and the amplified input average, and a third output signal corresponding to a sum of amplified third difference and amplified input average; a plurality of output terminals which output the output signals, including the first output signal, the second output signal and the third output signal; and a reduction circuit connected to the amplification unit and configured to reduce the common mode gain less than the differential mode gain.

BRIEF DESCRIPTION OF THE SEVERAL VIEWS OF THE DRAWING

FIG. 1 is a circuit diagram of an amplifier in a first embodiment of the present invention;

FIG. 2 is a circuit diagram of an amplifier in a second embodiment of the present invention;

FIG. 3 is an explanatory view of a three-dimensional vector space;

FIG. 4 is a circuit diagram of an amplifier in a third embodiment of the present invention;

FIG. 9 is a circuit diagram of a common mode feedback circuit using a switched capacitor;

FIG. 10 is a circuit diagram of an amplifier in a seventh embodiment of the present invention;

FIG. 11 is a circuit diagram of an amplifier in an eighth embodiment of the present invention;

FIG. 12 is a circuit diagram of a typical example of the amplifier in the eighth embodiment of the present invention;

DETAILED DESCRIPTION OF THE INVENTION

Figure 5:
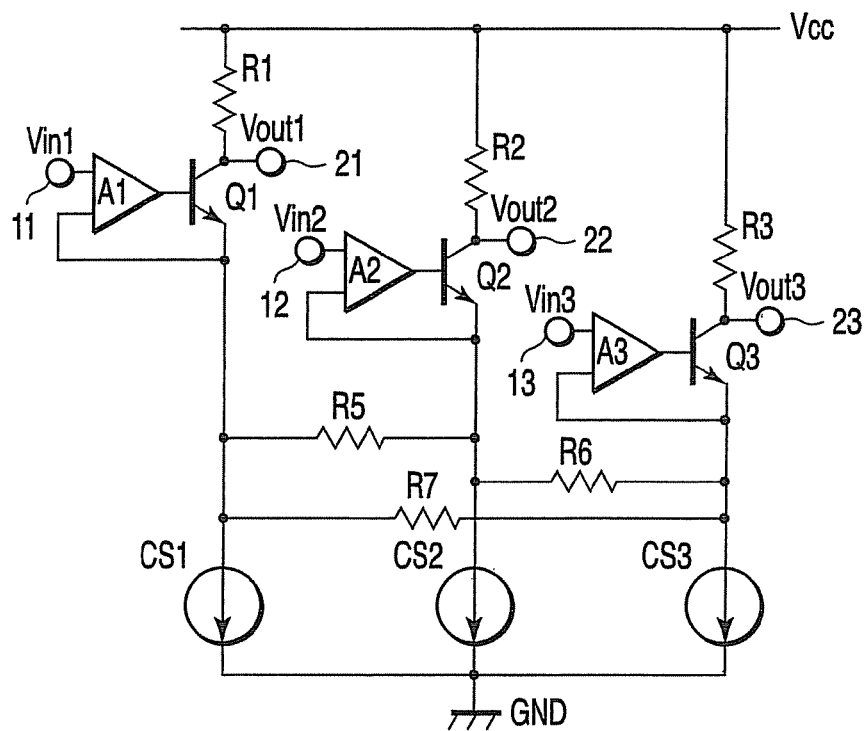
FIG. 5 is a circuit diagram of an amplifier in a fourth embodiment of the present invention.

There will be described hereinafter several embodiments of the present invention in detail with reference to the drawings.

First Embodiment

In an amplifier of a first embodiment of the present invention shown in FIG. 1, input signals Vin1, Vin2, and Vin3 are input into input terminals 11, 12, and 13, and amplified output signals Vout1, Vout2, and Vout3 are output from output terminals 21, 22, and 23, respectively. The input terminals 11, 12, and 13 are connected to gate terminals of N-type MOS (NMOS) transistors M1, M2, and M3, respectively. A common source terminal of the transistors M1, M2, and M3 is connected to a current source CS. Drain terminals of the transistors M1, M2, and M3 are connected to the output terminals 21, 22, and 23, respectively, and are also connected to a power supply Vdd via load resistors R1, R2, and R3, respectively.

The transistors M1, M2, and M3 have an equal gate length and an equal gate width, and further an equal transconductance gm in a case where a manufacturing error is ignored. The load resistors R1, R2, and R3 have an equal resistance R excluding an error.

In the amplifier of FIG. 1, the current source CS sets a common mode gain of a common mode output Voutcom with respect to a common mode input Vincom to be lower than a differential mode gain of a differential mode output with respect to a differential mode input. The common mode input Vincom is an average (Vin1+Vin2+Vin3)/3 of the input signals Vin1, Vin2, and Vin3. The common mode output Voutcom is an average (Vout1+Vout2+Vout3)/3 of the output signals Vout1, Vout2, and Vout3. The differential mode input is differences Vin1−Vincom, Vin2−Vincom, and Vin3−Vincom between the input signals Vin1, Vin2, and Vin3 and the common mode input Vincom. The differential mode output is differences Vout1−Voutcom, Vout2−Voutcom, and Vout3−Voutcom between the output signals Vout1, Vout2, and Vout3 and the common mode output Voutcom. However, it is assumed that the input signals Vin1, Vin2, and Vin3, the common mode input Vincom, the output signals Vout1, Vout2, and Vout3, and the common mode output Voutcom are voltage signals. This case will be described hereinafter in more detail.

In a case where the same input signals Vin1, Vin2, and Vin3 are input into the three input terminals 11, 12, and 13, a current of ⅓ of a current Ibias of the current source CS flows into the drain terminals of the transistors M1, M2, and M3. Supposing that the current source CS is an ideal current source, the drain currents of the transistors M1, M2, and M3 are constant regardless of an input signal voltage. When the drain currents of the transistors M1, M2, and M3 are constant, the voltages of the output signals Vout1, Vout2, and Vout3 do not vary. Therefore, the common mode gain turns to 0. In fact, since the current source CS is realized using the transistor or the like, the source has a finite output impedance. However, if the output impedance of the current source CS is large as compared with the values of the load resistors R1, R2, and R3, the common mode gain has a small value close to 0.

On the other hand, the differential mode gain of the differential mode output with respect to the differential mode input is given by a product gmR of the transconductance gm of the transistors M1, M2, and M3 and the resistance R of the load resistors R1, R2, and R3.

A sum of the differential mode inputs Vin1-Vincom, Vin2−Vincom, and Vin3−Vincom is Vin1+Vin2+Vin3−3Vincom. Since the common mode input Vincom is (Vin1+Vin2+Vin3)/3, the sum Vin1+Vin2+Vin3−3Vincom is apparently 0. This is similar to a differential amplifier. For example, when Vin1 rises, Vin2 and Vin3 decline while keeping balance. Therefore, there is suppressed a voltage variance of a common source node of the transistors M1, M2, and M3 shown in FIG. 1. Therefore, since the transistors M1, M2, and M3 operate with respect to a differential mode as if the source terminal were grounded, the gain of the amplifier is gmR.

When three input terminals are disposed, it is possible to represent a rotating direction of the signal as apparent from a driving principle of a three-phase induction motor. A function of indicating the rotating direction of the signal can be said to be the same as a function using the I-signal and the Q-signal in radio communication. On the other hand, three differential signals are the same as differential signals handled in the differential amplifier in that the sum is zero as described above. Therefore, three differential signals have virtual analog ground potentials, but no signal current flows into the analog ground potential. Therefore, in the amplifier of the present embodiment, it is not necessary to prepare the analog ground buffer amplifier having a high current supply (or current absorbing) capability. In the amplifier of the present embodiment, for example, in a case where the I-signal and the Q-signal are amplified, the analog ground buffer amplifier required for a single end system is not required. Therefore, the present embodiment is suitable for low power consumption.

On the other hand, in the amplifier in which the I-signal and the Q-signal are amplified in a differential system, four load resistors are required. In the amplifier of the present embodiment, it is possible to amplify complex signals such as the I-signal and the Q-signal. However, as it is sufficient with three load resistors, the number of necessary components is less than those of a usual differential system. Therefore, an occupying area on a semiconductor chip can be reduced, and the present embodiment is suitable for cost reduction. In the amplifier of FIG. 1, it is possible to amplify not only complex signals such as the I-signal and the Q-signal but also an output vector signal of a two-dimensional acceleration sensor or the like.

In a case where n-dimensional vector is handled as an analog signal in this manner, when each vector element is amplified by the differential amplifier, 2n loads are required. On the other hand, the loads can be reduced to n+1 loads in the amplifier of the present embodiment.

The MOS transistors are used in FIG. 1, but needless to say, the MOS transistors may be replaced with bipolar transistors. In this case, the gate terminal, the drain terminal, and the source terminal of the MOS transistor may correspond to a base terminal, a collector terminal, and an emitter terminal of a bipolar transistor, respectively. The gate terminal of the MOS transistor and the base terminal of the bipolar transistor are generically referred to as control terminals. The drain terminal of the MOS transistor and the collector terminal of the bipolar transistor are generically referred to as first main terminals. The source terminal of the MOS transistor and the emitter terminal of the bipolar transistor are generically referred to as second main terminals. The MOS transistor and the bipolar transistor can be replaced with each other, and this also applies to the following embodiments.

As described above, the amplifier of the present embodiment does not require the analog ground buffer amplifier required for the single end system. Therefore, the present embodiment is suitable for the reduction of the power consumption. Furthermore, the amplifier of the present embodiment can amplify complex signals such as the I-signal and the Q-signal, but the number of required circuit elements such as load resistors is less than those of the usual differential system. Therefore, it is possible to reduce the occupying area on the semiconductor chip and the cost.

Second Embodiment

FIG. 2 shows an amplifier in a second embodiment of the present invention. An input terminal 14, an output terminal 24, a transistor M4, and a load resistor R4 are added to the amplifier of FIG. 1. Transistors M1, M2, and M3, and the transistor M4 have an equal gate length and an equal gate width, and further an equal transconductance gm in a case where a manufacturing error is ignored. Load resistors R1, R2, and R3 and the load resistor R4 have an equal resistance R excluding an error.

In the amplifier of FIG. 2, in the same manner as in the amplifier of FIG. 1, a common mode gain of a common mode output as an average of output signals Vout1, Vout2, Vout3, and Vout4 with respect to a common mode input as an average of input signals Vin1, Vin2, Vin3, and Vin4 is set smaller than a differential mode gain of a differential mode output as a common mode output difference of the output signals Vout1, Vout2, Vout3, and Vout4 with respect to a differential mode input as a common mode input difference of the input signals Vin1, Vin2, Vin3, and Vin4.

The amplifier of FIG. 1 is suitable for amplification of two-dimensional vector signals, for example, complex vector signals such as an I-signal and a Q-signal. The amplifier of FIG. 2 is similarly suitable for amplification of a three-dimensional vector signal. FIG. 3 is a diagram showing a three-dimensional vector space. In the three-dimensional vector space, a rectangular coordinate system is often used which represents a vector on three coordinate axes x, y, and z crossing one another at right angles. To amplify a signal represented by a rectangular coordinate, when an amplifier of a single end system is used, an analog ground buffer amplifier having a large current driving capability is required for supplying an analog ground potential, and power consumption is increased. In a differential system, since two input terminals are required for each of three orthogonal signals, six load resistors in total are required.

As shown in FIG. 3, the three-dimensional vector can be represented using a center of gravity G as a base point and four directions toward vertexes a, b, c, and d of a regular tetrahedron as coordinate axes. It is assumed that vector lengths of the four directions are four elements of the signal, and one three-dimensional vector is shown as a synthesized vector of the four-direction vectors. A degree of freedom seems to increase by one, but when there is added a condition that a sum of lengths (scalar) of four vectors is zero, a degree of freedom remains to be three. The amplifier of FIG. 2 is suitable for the amplification of an analog signal in which such three-dimensional vector is represented by four axes. This is because the circuit has a function of amplifying a differential mode signal and removing a common mode signal. In a case where three axes crossing one another at right angles are amplified by a usual two-input/two-output differential amplifier, six load resistors are required. On the other hand, in the amplifier of FIG. 2, four load resistors R1, R2, R3, and R4 are sufficient. Therefore, since there are less components, an occupying area on a semiconductor chip is small, and cost can be reduced. Since a sum (sum of scalar) of differential components of four signals is zero, a common mode voltage is a virtual analog ground potential, but no signal current flows. Therefore, the analog ground buffer required for the single end system is not required, and the present embodiment is suitable for reduction of power consumption.

Third Embodiment

FIG. 4 is an amplifier in a third embodiment of the present invention. A bipolar transistor is used. Input terminals 11, 12, and 13 are connected to base terminals of bipolar transistors (npn transistors in this example) Q1, Q2, and Q3. Emitter terminals of the transistors Q1, Q2, and Q3 are connected to current sources CS1, CS2, and CS3, respectively. Degeneration resistors R5, R6, and R7 are connected between the emitter terminals of the transistors Q1 and Q2, between the emitter terminals of the transistors Q2 and Q3, and between the emitter terminals of the transistors Q1 and Q3, respectively. Collector terminals of the transistors Q1, Q2, and Q3 are connected to output terminals 21, 22, and 23, respectively, and also connected to a power source Vcc via load resistors R1, R2, and R3.

The transistors Q1, Q2, and Q3 have an equal emitter area, and an equal transconductance in a case where a manufacturing error is ignored. The load resistors R1, R2, and R3 also have an equal resistance excluding an error. The degeneration resistors R5, R6, and R7 have an equal resistance ignoring an error.

In the amplifier of FIG. 4, in the same manner as in the amplifier of FIG. 1, a common mode gain of a common mode output Voutcom as an average of output signals Vout1, Vout2, and Vout3 with respect to a common mode input Vincom as an average of input signals Vin1, Vin2, and Vin3 set by the current sources CS1, CS2, and CS3 and the degeneration resistors R5, R6, and R7 is set smaller than a differential mode gain of a differential mode output as a common mode output difference of the output signals Vout1, Vout2, and Vout3 with respect to a differential mode input as a common mode input difference of the input signals Vin1, Vin2, and Vin3. It is assumed that the input signals Vin1, Vin2, and Vin3, the common mode input Vincom, the output signals Vout1, Vout2, and Vout3, and the common mode output Voutcom are all voltage signals.

The circuit of FIG. 4 will be described hereinafter in detail. In a case where the same signals Vin1, Vin2, and Vin3 are input into the input terminals 11, 12, and 13, a current determined by the current sources CS1, CS2, and CS3 flows as an output current into the collector terminals of the transistors Q1, Q2, and Q3. If CS1, CS2, and CS3 are ideal current sources, collector currents of the transistors Q1, Q2, and Q3 are constant regardless of voltages of the input signals Vin1, Vin2, and Vin3. When the collector currents of the transistors Q1, Q2, and Q3 are constant, the output signals Vout1, Vout2, and Vout3 do not vary. Therefore, the common mode gain turns to zero. In fact, since the current source has a finite output impedance, the common mode gain has a small value close to zero.

On the other hand, the degeneration resistors R5, R6, and R7 have an effect of enlarging linear input regions of the transistors Q2 and Q3. The differential mode gain is determined by transconductances gm of the transistors Q1, Q2, and Q3, the load resistors R1, R2, and R3, and the degeneration resistors R5, R6, and R7. Even in such three-input and three-output amplifier, the degeneration resistors R5, R6, and R7 can enlarge the linear input region in the same manner as in a single end amplifier or a two-input and two-output differential amplifier.

Fourth Embodiment

FIG. 5 shows an amplifier in a fourth embodiment of the present invention. Two-input and one-output operational amplifiers A1, A2, and A3 are inserted between input terminals 11, 12, and 13 and transistors Q1, Q2, and Q3 in the amplifier of FIG. 4, respectively. That is, Vin1, Vin2, and Vin3 are connected to non-inverting inputs of the operational amplifiers A1, A2, and A3, outputs of the amplifiers A1, A2, and A3 are connected to base terminals of the transistors Q1, Q2, and Q3, and there are feedbacks from the base terminals of the transistors Q1, Q2, and Q3 to inverting inputs of the amplifiers A1, A2, and A3.

The constitution of FIG. 5 is similar to a linearization technology for use in a differential transconductor amplifier, and can secure linearity, which is higher than that of the circuit of FIG. 4. The linearization technology for use in the differential transconductor amplifier in this manner is also applicable to a transconductor amplifier having three or more inputs.

Fifth Embodiment

Figure 6:
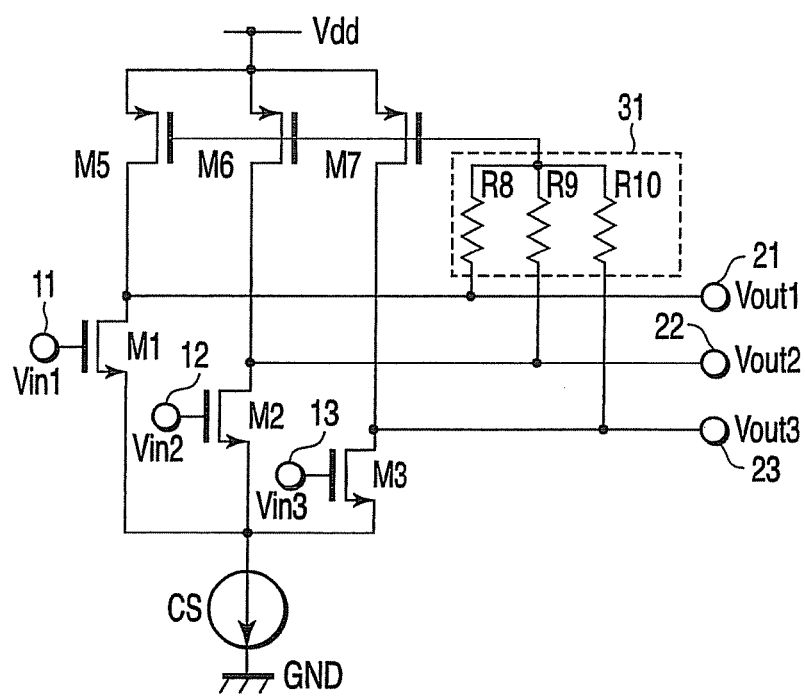
FIG. 6 is a circuit diagram of an amplifier in a fifth embodiment of the present invention.

FIG. 6 shows an amplifier in a fifth embodiment of the present invention. The load resistors R1, R2, and R3 in the amplifier of FIG. 1 are replaced with a current source circuit includes P-type MOS (PMOS) transistors M5, M6, and M7.

The amplifier of the present embodiment is similar to that of FIG. 1 in that a common mode gain of a common mode output as an average of output signals Vout1, Vout2, and Vout3 with respect to a common mode input as an average of input signals Vin1, Vin2, and Vin3 is set smaller than a differential mode gain of a differential mode output as a common mode output difference of the output signals Vout1, Vout2, and Vout3 with respect to a differential mode input as a common mode input difference of the input signals Vin1, Vin2, and Vin3.

In FIG. 6, resistors R8, R9, and R10 detect a voltage of a common mode output of output terminals 21, 22, and 23, and form a common mode feedback circuit 31 which supplies a common feedback signal to gate terminals of the transistors M5, M6, and M7 of the current source circuit. This common mode feedback circuit 31 brings an impedance of the current source circuit as a load on a common mode into a state equal to a short circuit state between gate terminals and drain terminals of the transistors M5, M6, and M7. On the other hand, resistance of the resistors R8, R9, and R10 are load impedances as they are with respect to a differential mode.

In the amplifier of FIG. 1, when the resistances of the load resistors R1, R2, and R3 are increased, a voltage of the common mode output drops owing to a direct-current bias current, but a comparatively large resistance can be imparted in the amplifier of FIG. 6. The amplifier of FIG. 6 can increase a common mode rejection ratio (CMRR) (also referred to as the differential mode gain to common mode gain ratio) owing to an effect of the common mode feedback circuit 31. A circuit having a large CMRR is similar to two-input and two-output usual differential amplifier in that there are an effect of removing a noise of the common mode and an effect of keeping an output center voltage of the amplifier at a certain voltage regardless of a process or temperature variance.

Sixth Embodiment

Figure 7:
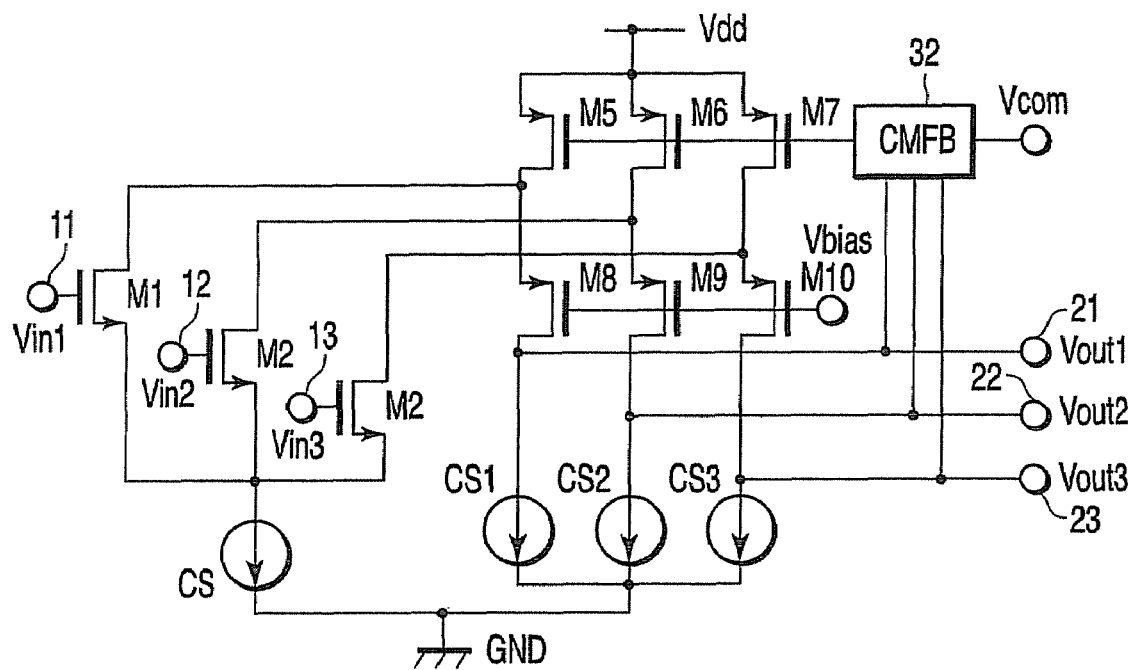
FIG. 7 is a circuit diagram of an amplifier in a sixth embodiment of the present invention.

FIG. 7 shows an amplifier in a sixth embodiment of the present invention. The amplifier is a three-input and three-output fall dead cascade type amplifier. That is, on the basis of the amplifier of FIG. 6, transistors M5, M6, M7, M8, M9, and M10 and current sources CS1, CS2, and CS3 form a fall dead cascade circuit. A certain bias voltage Vbias is supplied to gate terminals of the transistors M8, M9, and M10. This three-input and three-output fall dead cascade type amplifier has an advantage that an input allowable region of the common mode is broad in the same manner as in the two-input and two-output fall dead cascade type.

Output signals Vout1, Vout2, and Vout3 are output to output terminals 21, 22, and 23, and input into a common mode feedback circuit 32. In the common mode feedback circuit 32, a voltage of a common mode output is detected. The common mode feedback circuit 32 controls gate voltages of the transistors M5, M6, and M7 of a current source circuit so that the voltage of the common mode output comes close to a voltage of a common mode reference signal Vcom.

In the amplifier of FIG. 7, a very large differential mode gain can be obtained, whereas the common mode gain can be kept small, and a common mode rejection ratio can be raised. Therefore, there is an effect of removing a common mode noise such as a power supply voltage variance.

Figure 8:
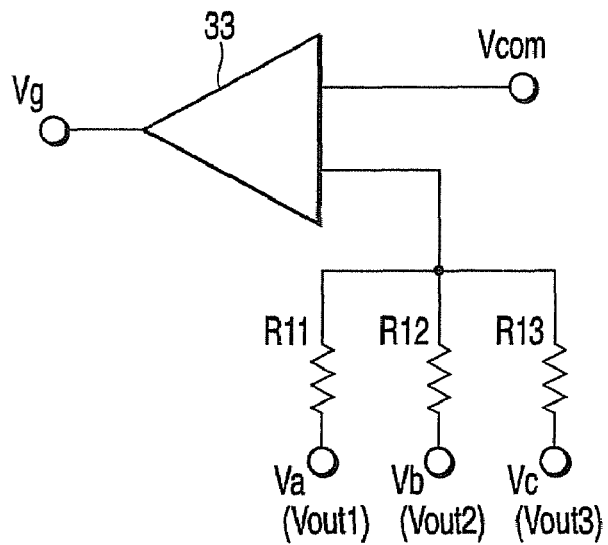
FIG. 8 is a circuit diagram of a common mode feedback circuit using resistors and an operational amplifier.

FIG. 8 shows a typical circuit example of the common mode feedback circuit 32 for use in the amplifier of FIG. 7. Resistors R11, R12, and R13 detect a voltage of a common mode output of signals Va, Vb, and Vc (corresponding to Vout1, Vout2, and Vout3), and the voltage is compared with a voltage of the common mode reference signal Vcom by an operational amplifier 33. An output voltage Vg of the operational amplifier 33 varies up and down owing to a size relation between the common mode output and the common mode reference signal Vcom, and the voltage is supplied as a common mode feedback signal to gate terminals of the transistors M5, M6, and M7 of FIG. 7.

FIG. 9 shows another specific example of the common mode feedback circuit 32 for use in the amplifier of FIG. 7. The circuit is a switched capacitor circuit including switches SW1 to SW8 and capacitors C1 to C6. A voltage change of the common mode output of the input signals Va, Vb, and Vc (corresponding to Vout1, Vout2, and Vout3) is transmitted to the output voltage Vg via the capacitors C1, C2, and C3. When the respective switches SW1 to SW8 repeatedly turn on and off in response to a clock signal, the capacitors C4, C5, and C6 are charged with a potential difference between a common mode reference voltage Vcom and a reference gate voltage Vgref, and the difference is transferred to the capacitors C1, C2, and C3.

Seventh Embodiment

FIG. 10 shows an amplifier in a seventh embodiment of the present invention. The circuit has three transconductor amplifiers 41, 42, and 43. In the transconductor amplifiers 41, 42, and 43, there are used transconductor amplifiers proposed in, for example, document "A 0.9 V 1.5 mW continuous-time $\Delta\Sigma$ modulator for WCDMA" published in 2004 IEEE International Solid-State Circuits Conference by Ueno et al.

Each of the transconductor amplifiers 41, 42, and 43 has two inverting inputs, and an equal output current is output to two outputs. Each of Vin1, Vin2, and Vin3 from input terminals 11, 12, and 13 is supplied to one input of each of transconductor amplifiers 41, 42, and 43. Each of output signals Vout1, Vout2, and Vout3 is obtained from one output of each of the transconductor amplifiers 41, 42, and 43 to output terminals 21, 22, and 23.

A common mode feedback (CMFB) is supplied from the other output of each of the transconductor amplifiers 41, 42, and 43 to the other input. A common mode feedback voltage is determined so that a sum of output currents from the transconductor amplifiers 41, 42, and 43 is zero. This is a current mode common mode feedback circuit.

Such a common mode feedback circuit sets a common mode gain of a common mode output as an average of the output signals Vout1, Vout2, and Vout3 with respect to a common mode input as an average of the input signals Vin1, Vin2, and Vin3 to be smaller than a differential mode gain of a differential mode output as a common mode output difference of the output signals Vout1, Vout2, and Vout3 with respect to a differential mode input as a common mode input difference of the input signals Vin1, Vin2, and Vin3.

The transconductor amplifier for use herein, disclosed in the document "A 0.9 V 1.5 mW continuous-time $\Delta\Sigma$ modulator for WCDMA" can operate at a low power supply voltage of 1 V or less. This characteristic is maintained even in the three-input and three-output amplifier shown in FIG. 10. Moreover, a constitution similar to that of the present embodiment can be taken with three or more arbitrary inputs/outputs. Many common mode feedback circuits usable in the two-input and two-output differential amplifier in this manner are also applicable to a multiple-input and multiple-output amplifier of the present invention.

Eighth Embodiment

FIG. 11 shows an amplifier in an eighth embodiment of the present invention. The circuit has a three-input and three-output amplifier 51 and a common mode feedforward amplifier (CMFF) 52. Signals Vin1, Vin2, and Vin3 from input terminals 11, 12, and 13 are input into the amplifier 51 and the common mode feedforward amplifier 52. The amplifier 51 is similar to the amplifier in the first to third embodiments. The common mode feedforward amplifier 52 has a gain equal to an in-phase gain of the amplifier 51. The common mode feedforward amplifier detects in-phase signals in the input terminals 11, 12, and 13, amplifies the signals, and supplies in-phase output signals to output terminals 21, 22, and 23 in a phase reverse to that of in-phase output signals (in-phase signals included in output signals Vout1, Vout2, and Vout3).

Therefore, since the in-phase output signal from the amplifier 51 and that from the common mode feedforward amplifier 52 cancel each other in the output terminals 21, 22, and 23, an in-phase signal rejection ratio can be raised in the whole amplifier. In this manner, even in the three-input and three-output amplifier, three-input in-phase signals are detected to perform common mode feedforward amplification, whereby an in-phase signal rejection ratio can be raised by the common mode feedforward in the same manner as in the two-input and two-output differential amplifier.

FIG. 12 is a typical example of the amplifier of FIG. 11. The common mode feedforward amplifier 52 is added to the amplifier 51 shown in FIG. 1. The common mode feedforward amplifier 52 comprises an in-phase detection unit and a current mirror circuit (C.M.) 53. The in-phase detection unit includes transistors M11 to M14, and a current source CS10 connected to a common source terminal of the transistors M11 to M14. The in-phase detection unit detects the in-phase signals from the input terminals 11, 12, and 13 to compare the signals with a reference voltage Vref input to a gate terminal of the transistor M14. The current mirror circuit 53 inverts and amplifies the detected in-phase signals while distributing the signals to the output terminals 21, 22, and 23. That is, a current corresponding to the in-phase signal detected by the in-phase detection unit is output from common drains of the transistors M11, M12, and M13, and supplied to a current input terminal of the current mirror circuit 53. The current mirror circuit 53 has three current output terminals, and the current output terminals are connected to the output terminals 21, 22, and 23.

The amplifier 51 is an inverting amplifier, which inverts positive and negative polarities of the input signals Vin1, Vin2, and Vin3, and the output signals Vout1, Vout2, and Vout3. The transistors M11 to M13 of the common mode feedforward amplifier 52 invert and amplify the in-phase signals of the input terminals 11, 12, and 13 while detecting the signal, and the current mirror circuit 53 again inverts and amplifies the inverted and amplified in-phase signal while distributing the signals to the output terminals 21, 22, and 23, whereby it is possible to obtain in-phase output signals having the same polarity as that of the input signals Vin1, Vin2, and Vin3. In consequence, it is possible to cancel the in-phase output signal components of the amplifier 51 in the output terminals 21, 22, and 23.

Since the common mode feedforward amplifier 52 is combined and used in this manner, the whole amplifier can raise an in-phase signal rejection ratio.

Figure 13:
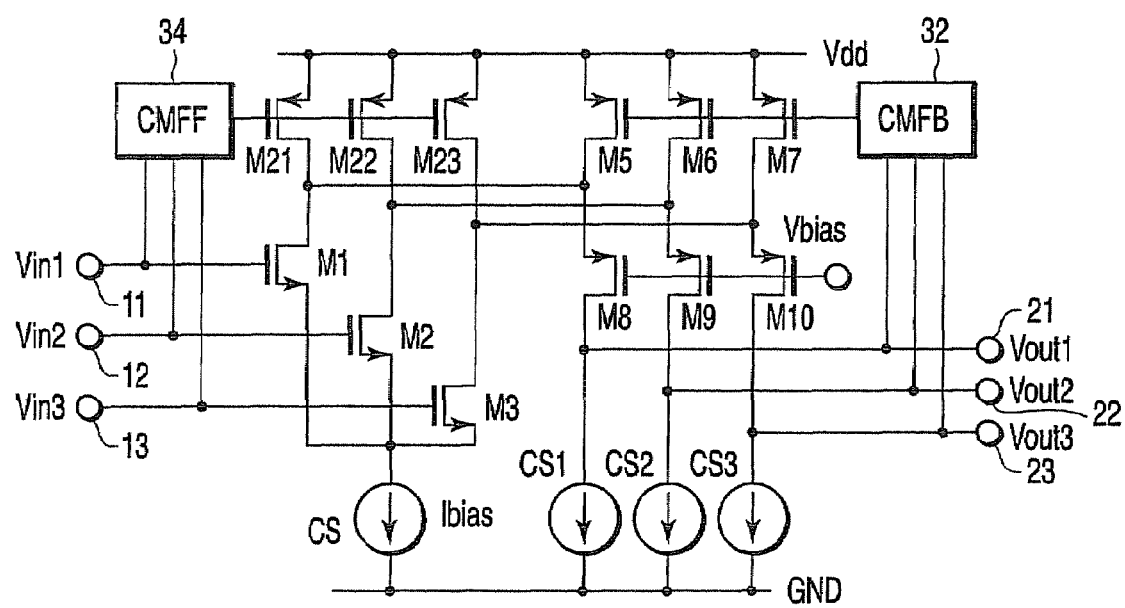
FIG. 13 is a circuit diagram of another typical example of the amplifier in the eighth embodiment of the present invention.

FIG. 13 shows another typical example of the amplifier of FIG. 11. A common mode feedforward circuit 34 is added to the amplifier of FIG. 7. The input signals Vin1, Vin2, and Vin3 are input into the gate terminals of transistors M1, M2, and M3, and also input into the common mode feedforward circuit 34. In the common mode feedforward circuit 34, common mode input voltages are detected from the input signals Vin1, Vin2, and Vin3, and supplied to gate terminals of PMOS transistors M21, M22, and M23 of a current source circuit.

On the other hand, the common mode feedback circuit 32 controls gate voltages of transistors M5, M6, and M7 so that a phase is inversed to that of an in-phase gain of the three-input and three-output amplifier.

Since the common mode feedback circuit and the common mode feedforward circuit are used at the same time in this manner, the common mode rejection ratio can be further raised.

Ninth Embodiment

Figure 14:
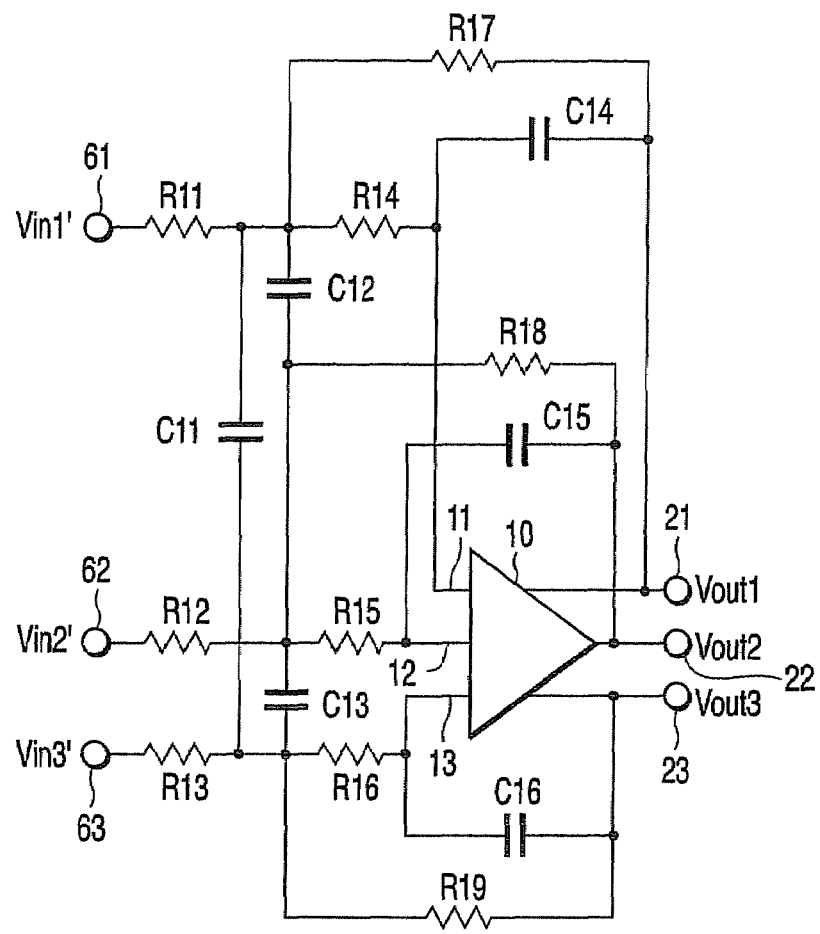
FIG. 14 is a circuit diagram of a three-phase filter in a ninth embodiment of the present invention.

FIG. 14 shows a three-phase filter in a ninth embodiment of the present invention. The filter has secondary low-pass characteristics in the same manner as in a filter (single end filter) of a single end system shown in FIG. 15. An amplifier 10 is one of the amplifiers in the first to eighth embodiments described above, and forms the three-phase filter together with a time constant circuit including resistors R11 to R19 and capacitors C11 to C16 connected between input terminals 61, 62, and 63 of the filter and input terminals 11, 12, and 13 of the amplifier 10, and between the input terminals 11, 12, and 13 and output terminals 21, 22, and 23. Filter input signals Vin1', Vin2', and Vin3' are supplied from the input terminals 61, 62, and 63, and filter output signals Vout1, Vout2, and Vout3 are obtained from the output terminals 21, 22, and 23 of the amplifier 10.

Figure 15:
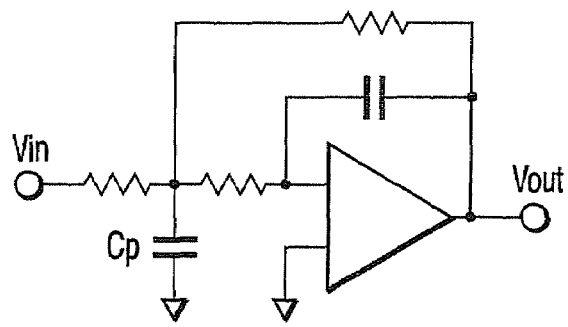
FIG. 15 is a circuit diagram of a single end filter.

In a case where a filter (differential filter) of a differential system corresponding to an I-signal and a Q-signal is realized using a single end filter of FIG. 15, components four times as many as those of the single end filter are required. According to the circuit of FIG. 14, the differential filter corresponding to the I-signal and the Q-signal can be realized by components three times as many as those of the single end filter of FIG. 15. That is, the circuit of FIG. 15 includes three resistors and two capacitors. When the differential filter corresponding to the I-signal and the Q-signal is prepared on the basis of the circuit of FIG. 15, the filter includes 3×2×2=12 resistors, and 2×2×2=8 capacitors. On the other hand, the circuit of FIG. 14 includes less components: nine resistors R11 to R19 and six capacitors C11 to C16. Accordingly, an occupying area of an integrated circuit can be reduced, and a filter incurring a reduced cost can be realized. Since a three-input and three-output amplifier including a common mode feedback circuit is used, a central potential of an output signal can be kept at an appropriate value.

Tenth Embodiment

Figure 16:
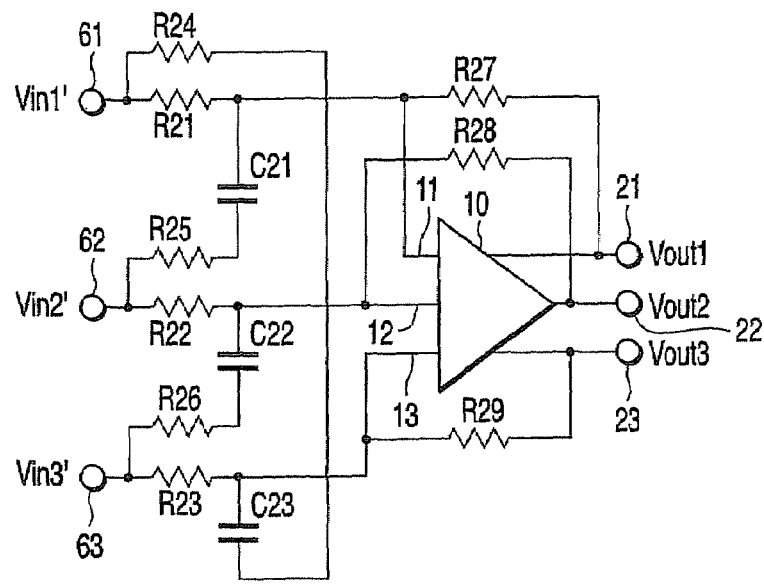
FIG. 16 is a circuit diagram of a three-phase filter in a tenth embodiment of the present invention.

FIG. 16 shows a three-phase filter in a tenth embodiment of the present invention. An amplifier 10 is one of the amplifiers in the first to eighth embodiments, and forms the three-phase filter together with a time constant circuit including resistors R21 to R29 and capacitors C21 to C23 connected between input terminals 61, 62, and 63 of the filter and input terminals 11, 12, and 13 of the amplifier 10, and between the input terminals 11, 12, and 13 and output terminals 21, 22, and 23.

Figures 17A, 17B:
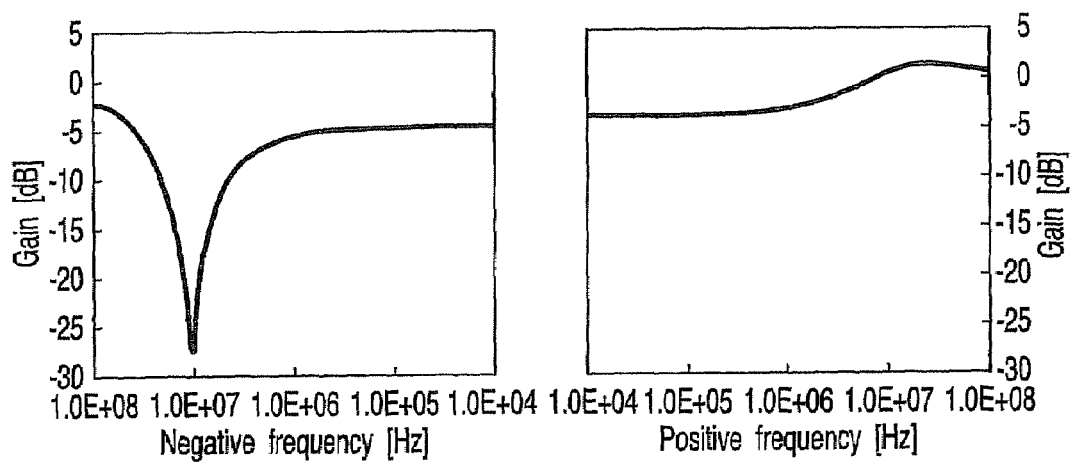
FIGS. 17A and 17B are diagrams showing frequency characteristics of the three-phase filter.

This three-phase filter is a complex filter exhibiting: frequency characteristics in a case where sinewave signals having phases of 0°, 120°, and 270°, respectively, are input as input signals Vin1', Vin2', and Vin3' into the input terminals 61, 62, and 63 of the filter; and frequency responses in a case where the sinewave signals having phases of 0°, 270°, and 120°, respectively, are input. FIGS. 17A and 17B are graphs showing frequency characteristics in counterclockwise rotation (negative frequency) and clockwise rotation (positive frequency), one graph shows a notch around 10 MHz, and the other graph indicates a maximum gain.

A circuit using a three-input and three-output amplifier as in the three-phase filters shown in FIGS. 14 and 16 is a complex-number signal processing circuit, and can realize a function equal to that of complex signal processing by an I-signal and a Q-signal.

Eleventh Embodiment

The above-described amplifiers and the filters in the first to tenth embodiments are applicable to, for example, an analog signal processing circuit of a radio communication device which modulates both amplitude and phase. In this case, a chip area can be reduced, and accordingly a necessary function can be provided inexpensively.

Figure 18:
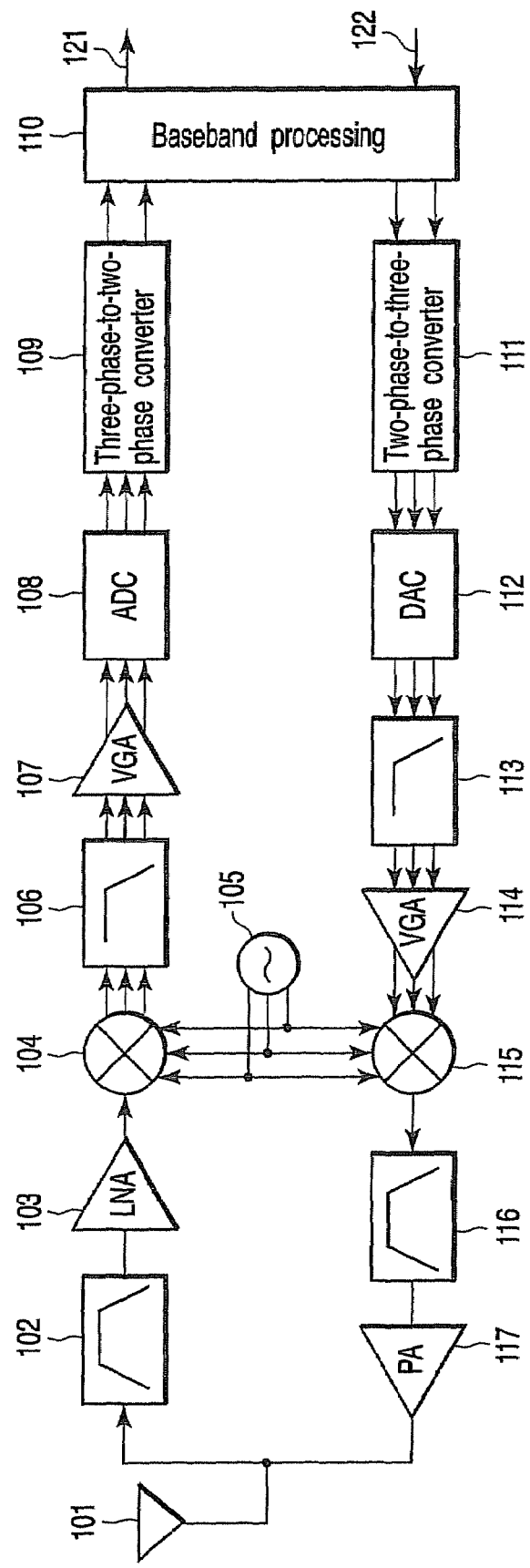
FIG. 18 is a block diagram of a radio communication device in an eleventh embodiment of the present invention.

FIG. 18 shows a radio communication device in an eleventh embodiment of the present invention to which the amplifier and the filter in the first to tenth embodiments are applied. First, a reception side will be described. A reception signal obtained by an antenna 101 receiving an RF signal is input into a low-noise amplifier 103, after a channel is roughly selected by a high-frequency filter 102 (e.g., a bandpass filter). A receiver includes the antenna 101, the high-frequency filter 102, and the low-noise amplifier 103.

An output signal of the low-noise amplifier 103 is input into a vector multiplier 104. A three-phase local signal generation unit 105 supplies three-phase local signals to the vector multiplier 104. A demodulator includes the vector multiplier 104 and the three-phase local signal generation unit 105. Three-phase baseband signals in the vicinity of a direct current appear in outputs of the vector multiplier 104.

In a case where the vector multiplier 104 is used as a demodulator similar to a conventional quadrature demodulator, a modulated signal represented by the following equation is input into an RF input terminal of the vector multiplier 104:

$$I(t)\cos \omega t + Q(t)\sin \omega t \qquad (1)$$

wherein I(t) denotes an in-phase signal (I-signal), and Q(t) denotes a quadrature-phase signal (Q-signal).

On the other hand, three-phase local signals represented by the following equations are input from the three-phase local signal generation unit 105 into local input terminals of the vector multiplier 104:

$$\left.\begin{array}{l}\cos \omega t \\ \cos\left(\omega t + \frac{2}{3}\pi\right) = \cos \omega t \cos \frac{2}{3}\pi - \sin \omega t \sin \frac{2}{3}\pi \\ \cos\left(\omega t - \frac{2}{3}\pi\right) = \cos \omega t \cos \frac{2}{3}\pi + \sin \omega t \sin \frac{2}{3}\pi\end{array}\right\} \qquad (2)$$

The vector multiplier 104 multiplies the modulated signal of Equation (1) by the three-phase local signals of Equation (2). At this time, low-frequency components of output signals obtained in output terminals of the vector multiplier 104 are given by the following equation.

$$\left.\begin{array}{l}\frac{I(t)}{2} \\ \frac{-I(t)}{4} - \frac{\sqrt{3}\,Q(t)}{4} \\ \frac{-I(t)}{4} + \frac{\sqrt{3}\,Q(t)}{4}\end{array}\right\} \qquad (3)$$

In Equation (3), the I-signal I(t) can be extracted by passing an output signal from a first output terminal of the vector multiplier 104 through a low-pass filter. As to the Q-signal Q(t), after passing output signals from second and third output terminals of the vector multiplier 104 through the low-pass filter, respectively, the following calculation may be performed by an operational unit including an analog or digital circuit.

$$\left(\frac{-I(t)}{4}+\frac{\sqrt{3}\,Q(t)}{4}\right)-\left(\frac{-I(t)}{4}-\frac{\sqrt{3}\,Q(t)}{4}\right)=\frac{\sqrt{3}\,Q(t)}{2} \quad (4)$$

In the same manner as in a usual direct conversion receiver, a baseband filter 106 (e.g., a low-pass filter) selectively extracts necessary frequency components, for example, low-frequency components of Equation (3) from the output signals of the vector multiplier 104. Output signals of the baseband filter 106 are amplified into signals having an amplitude suitable for analog-to-digital conversion by a variable gain amplifier 107, and thereafter input into an analog-to-digital converter 108. Three-phase digital baseband signals are output from the analog-to-digital converter 108.

The three-phase digital baseband signals are input into a three-phase to two-phase converter 109. The three-phase to two-phase converter 109 converts the three-phase digital baseband signals into usual two I and Q phase digital baseband signals as two-phase signals by, for example, calculation shown by Equation (4). The two-phase digital baseband signals are sent to a baseband processing section 110. The baseband processing section 110 decodes the two-phase digital baseband signals to obtain reception data 121.

Next, a transmission side will be described. The baseband processing section 110 outputs two-phase digital baseband signals of I and Q generated in accordance with transmission data 122. The two-phase digital baseband signals are converted into the three-phase digital baseband signals by processing the reverse that of the three-phase to two-phase converter 109 by a two-phase to three-phase converter 111. The three-phase digital baseband signals are converted into analog signals (analog modulation signals) by a digital-to-analog converter 112, respectively.

A baseband filter 113 (e.g., a low-pass filter) removes high-pass side unnecessary components from the analog modulation signals output from the digital-to-analog converter 112. Furthermore, a variable gain amplifier 114 amplifies the signals into appropriate amplitudes, and the signals are input into a vector multiplier 115. Three-phase local signals are supplied from the three-phase local signal generation unit 105 to the vector multiplier 115. A modulator includes the vector multiplier 115 and the three-phase local signal generation unit 105. A high-frequency modulated signal is output from the vector multiplier 115.

A high-frequency filter (e.g., a band pass filter) 116 removes a higher harmonic component from the modulated signal output from the vector multiplier 115. An output signal of the high-frequency filter 116 is amplified into a necessary power by a power amplifier 117, and supplied to the antenna 101. Accordingly, the antenna 101 transmits an RF signal. A transmitter includes the high-frequency filter 116, the power amplifier 117, and the antenna 101.

Here, the amplifiers described with reference to FIGS. 1 to 13 are applicable to, for example, the variable gain amplifiers 107 and 114 shown in FIG. 18. On the other hand, the three-phase filters described with reference to FIGS. 14 to 17 are applicable to the baseband filters 106 and 113 shown in, for example, FIG. 18.

In a case where the amplifier or the filter in the above-described embodiments of the present invention is used as the analog signal processing circuit of the radio communication device, which modulates both amplitude and phase, the chip area of the integrated circuit can be reduced, and accordingly, the necessary function can be provided inexpensively. Even in a case where the amplifier or the filter is used as a signal amplifying amplifier such as an acceleration sensor or an analog vector signal processing circuit such as a filter for removing an unnecessary signal, the components and the chip area of the integrated circuit can be reduced, and an inexpensive device can be provided as compared with the differential system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier comprising:
   at least three input terminals which receive a plurality of input signals;
   an amplification unit configured to amplify the input signals by a common mode gain and a different mode gain to output at least three output signals;
   at least three output terminals which output the output signals; and
   a setting circuit configured to set the common mode gain less than the differential mode gain.

2. The amplification circuit according to claim 1, wherein the common mode gain represents a gain of the common mode output indicating an average of the signals with respect to a common mode input indicating an average of the input signals, and the differential mode gain represents a common gain of at least three differential mode outputs with respect to at least three differential mode inputs, the differential mode outputs each representing a difference between each of the output signals and the common mode output, and the differential mode inputs each representing a difference between each of the input signals and the common mode input.

3. An amplifier comprising:
   a first input terminal which inputs first input signal;
   a second input terminal which inputs second input signal;
   a third input terminal which inputs third input signal;
   an amplification unit configured to amplify the first input signal, second input signal, and third input signal by a differential mode gain and a common mode gain to output a first output signal, a second output signal, and a third output signal;
   a first output terminal which outputs the first output signal;
   a second output terminal which outputs the second output signal;
   a third output terminal which outputs the third output signal; and
   a setting circuit configured to set the common mode gain less than the differential mode gain.

4. The amplifier according to claim 3, wherein the common mode gain represents a gain of the common mode output indicating an average of the first, second, and third output signals with respect to a common mode input indicating an average of the first, second, and third input signals, and the differential mode gain represents a common gain of a plurality of differential mode outputs with respect to first, second, and third differential mode inputs, the differential mode outputs each representing a difference between each of the first, second, and third output signals and the common mode output, and the differential mode inputs each representing a difference between each of the first, second, and third input signals and the common mode input.

5. The amplifier according to claim 3, wherein the amplification unit includes first, second, and third transistors including control terminals connected to the first, second, and third input terminals, respectively, first main terminals connected to the first, second, and third output terminals, respectively, and a common second main terminal; and first, second, and third loads connected to the first main terminals of the first, second, and third transistors, respectively.

6. The amplifier according to claim 3, wherein the amplification unit includes first, second, and third transistors including control terminals connected to the first, second, and third input terminals, respectively, first main terminals connected to the first, second, and third output terminals, respectively, and a common second main terminal; and first, second, and third loads connected to the first main terminals of the first, second, and third transistors, respectively, and the reduction circuit includes a current source connected to the common second main terminal.

7. The amplifier according to claim 6, wherein the first, second, and third loads include fourth, fifth, and sixth current sources, respectively; and the which further comprises a common mode feedback circuit configured to detect the output average and feed the detected output average back to the fourth, fifth, and sixth current sources.

8. The amplifier according to claim 3, wherein the amplification unit includes a first transistor having a control terminal connected to the first input terminal, a first main terminal connected to the first output terminal, and a second main terminal; a second transistor having a control terminal connected to the second input terminal, a first main terminal connected to the second output terminal, and a second main terminal; a third transistor having a control terminal connected to the third input terminal, a first main terminal connected to the third output terminal, and a second main terminal; a first load connected to the first main terminal of the first transistor; a second load connected to the first main terminal of the second transistor; and a third load connected to the first main terminal of the third transistor.

9. The amplifier according to claim 3, wherein the amplification unit includes a first transistor having a control terminal connected to the first input terminal, a first main terminal connected to the first output terminal, and a second main terminal; a second transistor having a control terminal connected to the second input terminal, a first main terminal connected to the second output terminal, and a second main terminal; a third transistor having a control terminal connected to the third input terminal, a first main terminal connected to the third output terminal, and a second main terminal; a first load connected to the first main terminal of the first transistor; a second load connected to the first main terminal of the second transistor; and a third load connected to the first main terminal of the third transistor, and the reduction circuit includes a first current source connected to the second terminal of the first transistor; a second current source connected to the second terminal of the second transistor; a third current source connected to the second terminal of the third transistor; a first degeneration resistor connected between the second main terminal of the first transistor and the second main terminal of the second transistor; a second degeneration resistor connected between the second main terminal of the second transistor and the second main terminal of the third transistor; and a third degeneration resistor connected between the second main terminal of the first transistor and the second main terminal of the third transistor.

10. The amplifier according to claim 9, wherein the first, second, and third loads include fourth, fifth, and sixth current sources, respectively, the amplifier further comprising:

a common mode feedback circuit configured to detect the output average and feed the detected output average back to the fourth, fifth, and sixth current sources.

11. The amplifier according to claim 3, which further comprises a common feedforward amplifier configured to amplify in-phase signals of the first, second, and third input terminals and supply the amplified in-phase signals to the first, second, and third output terminals in a phase inverse to that of in-phase signals included in the first, second, and third output signals, the common feedforward amplifier having the same gain as an in-phase gain of the amplification unit.

12. The amplifier according to claim 6, wherein the first, second, and third loads include fourth, fifth, and sixth current sources, respectively, and which further comprises a common mode feedback circuit configured to detect the output average and feed the detected output average back to the fourth, fifth, and sixth current sources.

13. The amplifier according to claim 8, wherein the first, second, and third loads include fourth, fifth, and sixth current sources, respectively, the amplifier further comprising:

a common mode feedback circuit configured to detect the output average and feed the detected output average back to the fourth, fifth, and sixth current sources.

14. The amplifier according to claim 9, wherein the amplification unit includes first, second, and third transistors including control terminals connected to the first, second, and third input terminals, respectively, and first main terminals connected to the first, second, and third output terminals, respectively; and first, second, and third loads connected to the first main terminals of the first, second, and third transistors, respectively, and the common mode feedforward amplifier includes an in-phase detection unit configured to detect an in-phase signal of the first, second, and third input terminals and obtain a first current corresponding to the detected in-phase signal; and a current mirror circuit having a current input terminal which receives the first current, and first, second, and third current output terminals which output a second current corresponding to the first current, the first, second, and third current output terminals being connected to the first, second, and third output terminals.

15. The amplifier according to claim 3, wherein the amplification unit has a first transconductor amplifier having first and second inverting inputs, and first and second outputs which output the same current, the first inverting input being connected to the first input terminal, the first output being connected to the first output terminal; a second transconductor amplifier having third and fourth inverting inputs, and third and fourth outputs which output the same current, the third inverting input being connected to the second input terminal, the third output being connected to the second output terminal; and a third transconductor amplifier having fifth and sixth inverting inputs and fifth and sixth outputs which output the same output current, the fifth inverting input being connected to the third input terminal, the fifth output being connected to the third output terminal, and the reduction circuit includes a common mode feedback circuit configured to feed output average currents from the second, fourth, and sixth outputs back to the second, fourth, and sixth inverting inputs.

16. A filter comprising:

the amplifier according to claim 3; and a time constant circuit including: fourth, fifth, and sixth input terminals which receive fourth, fifth, and sixth input signals, respectively; and a plurality of resistors and a plurality of capacitors connected between the first, second, and third input terminals and the fourth, fifth, and sixth input terminals and between the first, second, and third input terminals and the first, second, and third output terminals.

17. A radio communication device comprising:
a receiver which receives a radio frequency signal;
a demodulator which demodulates an output signal from the receiver in order to generate first, second, and third baseband signals;
the amplifier according to claim 3 which receives the first, second, and third baseband signals and which amplifies the first, second, and third baseband signals in order to output first, second, and third output baseband signals;
an analog-to-digital converter which converts the first, second, and third output baseband signals into digital baseband signals; and
a processing unit configured to receive the digital baseband signals and perform processing for decoding.

18. A radio communication device comprising:
a processing unit configured to process data to be transmitted in order to generate first, second, and third digital baseband signals;
a digital-to-analog converter which converts the first, second, and third digital baseband signals into first, second, and third analog baseband signals;
the amplifier according to claim 3 which receives the first, second, and third analog baseband signals and which amplifies the first, second, and third baseband signals in order to output first, second, and third output baseband signals;
a modulator which modulates the first, second, and third output baseband signals in order to output a radio frequency signal; and
a transmitter which transmits the radio frequency signal.

* * * * *